United States Patent [19]
Lai et al.

[11] Patent Number: 5,679,020
[45] Date of Patent: Oct. 21, 1997

[54] STOPPER FOR USE WITH ZIF PGA SOCKET

[75] Inventors: Ching-ho Lai; Chiung-Chuan Wang, both of Taipei Hsien, Taiwan; Robert G. McHugh, Evergreen, Colo.

[73] Assignee: Hon Hai Precision Ind. Co., Ltd., Taiwan

[21] Appl. No.: 536,069

[22] Filed: Sep. 29, 1995

[51] Int. Cl.⁶ ............................................. H01R 4/50
[52] U.S. Cl. ................................. 439/342; 439/259
[58] Field of Search .................... 439/259, 263–266, 439/342, 268–270

[56] References Cited

U.S. PATENT DOCUMENTS

| | | | |
|---|---|---|---|
| 5,256,079 | 10/1993 | Matsuoka | 439/342 |
| 5,443,591 | 8/1995 | Tsai | 439/342 |
| 5,454,727 | 10/1995 | Hsu | 439/342 X |

Primary Examiner—Khiem Nguyen

[57] ABSTRACT

A ZIF PGA socket (20) includes a base (22) and cover (24) slidably relatively moveable thereto, and a lever (40) sandwiched between the base (22) and the cover (24) wherein the lever (40) includes a handle (42) exposed and accessible in an exterior and a cam shaft (44) embedded within an upper half channel (30) formed in the cover (24) and a lower half channel (32) formed in the base (22). The cam shaft (44) includes a projection (50) integrally radially extending therefrom for engagement with an engagement surface (56) formed within an opening (54) in the base (22) whereby the lever (40) can be substantially stopped in a vertical position for allowing the socket (20) in an open status to load a PGA thereto in a ZIF manner. The handle (42) further includes a rib (60) formed proximate the front end thereof for engagement with a facing downward abutment surface (62) formed on the base (22).

6 Claims, 6 Drawing Sheets

STOPPER FOR USE WITH ZIF PGA SOCKET

BACKGROUND OF THE INVENTION

1. Field of the Invention

The invention relates to ZIF (Zero Insertion Force) PGA sockets, particularly to the structures formed on the lever to efficiently stop and hold the lever in a vertical position and thus leave the socket in an open position for zero-insertion-force engagement with a CPU mounted thereon.

2. The Prior Art

The CPU is the heart of the computer, commonly in form of PGA which is electrically connected to the mother board via a socket. Recently, ZIF PGA sockets are popularly used in the computer industry. The invention is generally an improvement of U.S. patent application Ser. No. 08/217,606 filed Mar. 24, 1994 (having been allowed but not issued), which is of a ZIF PGA socket. As shown in FIGS. 1 and 2, such traditional ZIF PGA socket 1 includes a rectangular base 2 and a corresponding rectangular cover 3 each having a plurality of passageways 4 for receiving therein a corresponding number of contacts (not shown) and/or pins 5 extending downward from a PGA chip 6. The cover 3 is slidably mounted on the base 2 with a lever 7 sandwiched therebetween. The lever 7 includes an operating handle 8 exposed and accessible in an exterior and a cam shaft 9 embedded within the upper half channel 10 in the cover 3 and the lower half channel 11 of the base 2 whereby when the handle 8 is rotated from the horizontal position to the vertical position, the cover 3 can be slidably moved with regard to the base 2 by means that the rotating cam shaft 9 engages and pushes the upper half channel 10 of the cover 3, accordingly. Thus, the whole socket 1 is arranged in an open status for ZIF consideration for receiving the corresponding PGA chip. It can be understood that from FIGS. 1 and 2, to stabilize the handle 8 of the lever 7 in the horizontal position, the base 2 includes a plate support 12 extending laterally from the base 2 for supporting the lying handle 8 of the lever 7, and the cover 3 includes a protrusion 13 to be received within an indent 14 of the handle 8 of the lever 7 for preventing the inadvertent upward rotative movement of the handle 8 of the lever 7. Oppositely, to stop the upward rotated handle 8 of the lever 7 to be in a vertical position, the base 2 includes a stopper post 14 for engagement with an engagement plane 15 formed on the upper surface 16 of the handle 8 of the lever 7.

There are still two disadvantages in such design. First, there is no proper means to maintain the handle 8 of the lever 7 in such vertical position for waiting for ZIF loading of the PGA chip on the socket. It can be appreciated that in a crowded and compact space within the computer case, any fingers or portions of the hand of an operator who tries to load a PGA chip on the socket 1, may inevitably confront the upright handle 8 and thus results in the handle 8 falling downward to its horizontal position. The better way to load the PGA chip, is that one hand holds the handle 8 of the lever 7 in position, i.e., in the vertical position, and the other hand grasps the PGA chip and load it onto the socket 1. It may be okey, while sometimes there is no sufficient space for allowing both hands to activate thereabout.

Secondly, to stop the handle 8 of the lever 7 in the vertical position is only based on the confrontation of the engagement plane 15 of the handle 8 of the lever 7 with the stopper post 14 of the base 2. It can be seen that the main actuating regions for slidably moving the cover 3 with regard to the base 2 are located on the cam shaft 9 of the lever 7 and the upper half channel 11 of the cover 3. Therefore, from a mechanical viewpoint, it is better to have such stop performance occur directly on the shaft 9 itself of the lever 7 for not resulting in any possible improper self-twist intention of the cam shaft 9 due to the position of the aforementioned actuating action, which is located on the shaft 9 of the lever 7, being far from the stop action which is located on the handle 8 of the lever 7.

Therefore, an object of the invention is to provide a ZIF PGA socket having properly positioned stopper means for stopping the handle of the lever in the predetermined vertical position, and further having retention means for efficiently holding the handle 8 of the lever 7 in such vertical position for allowing easy loading of the PGA chip.

SUMMARY OF THE INVENTION

According to an aspect of the invention, a ZIF PGA socket includes a base and a cover slidably relatively moveable thereto, and a lever sandwiched between the base and the cover wherein the lever includes a handle exposed and accessible in an exterior and a cam shaft embedded within an upper half channel formed on the bottom surface of the cover and a lower half channel formed on the top surface of the base. The shaft includes a projection integrally radially extending therefrom for engagement with an engagement surface formed within an opening in the base whereby the lever can be substantially stopped in a vertical position for allowing the socket in an open status to load a PGA thereto in a ZIF manner. The handle further includes a rib formed proximate the front end thereof for engagement with a downward abutment surface formed on the base.

BRIEF DESCRIPTION OF THE DRAWINGS

FIG. 3(A) is an enlarged view of the circle portion of FIG. 3 to show the through opening in the base of the socket.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
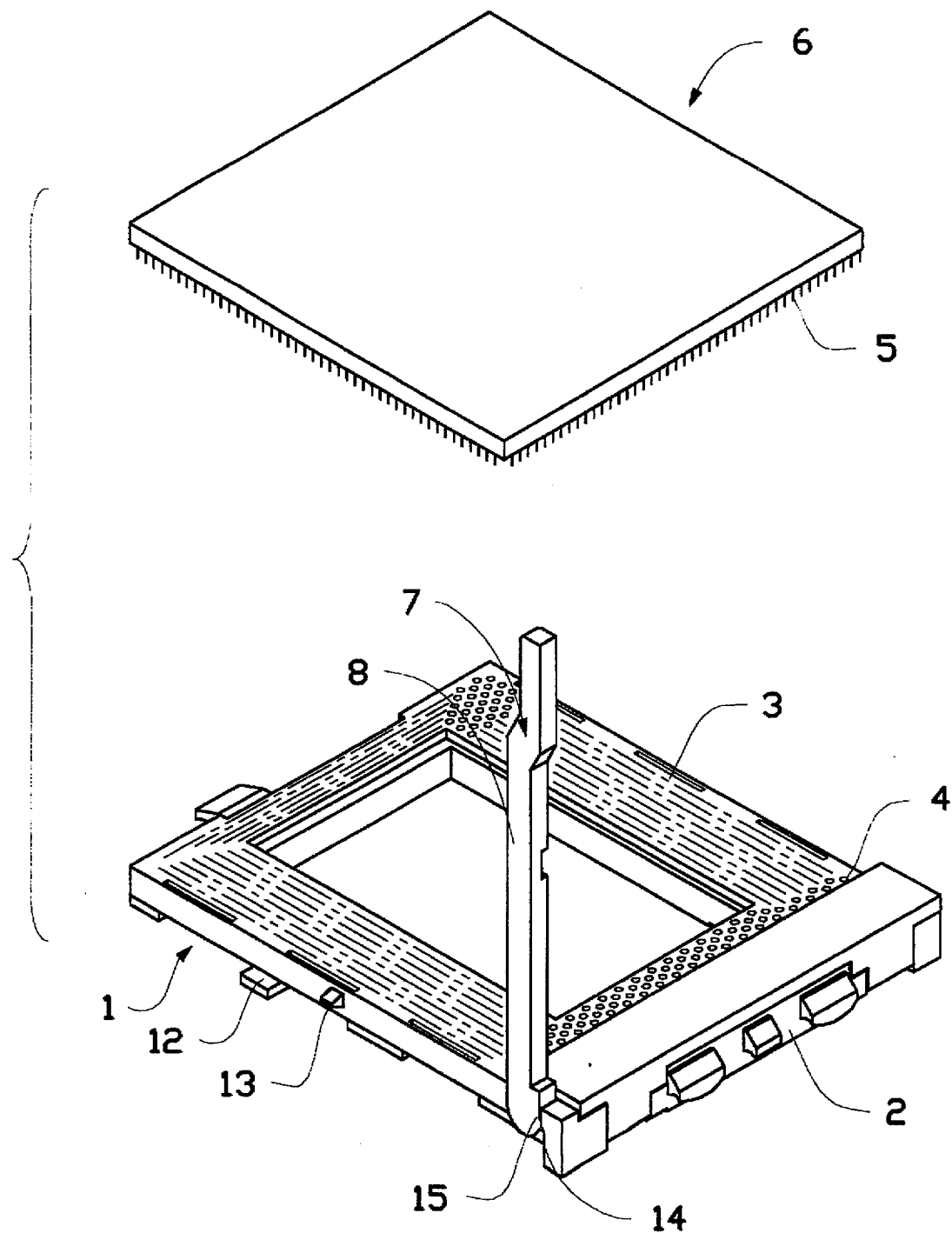
FIG. 1 is a conventional ZIF PGA socket and the corresponding PGA chip.
Figure 2:
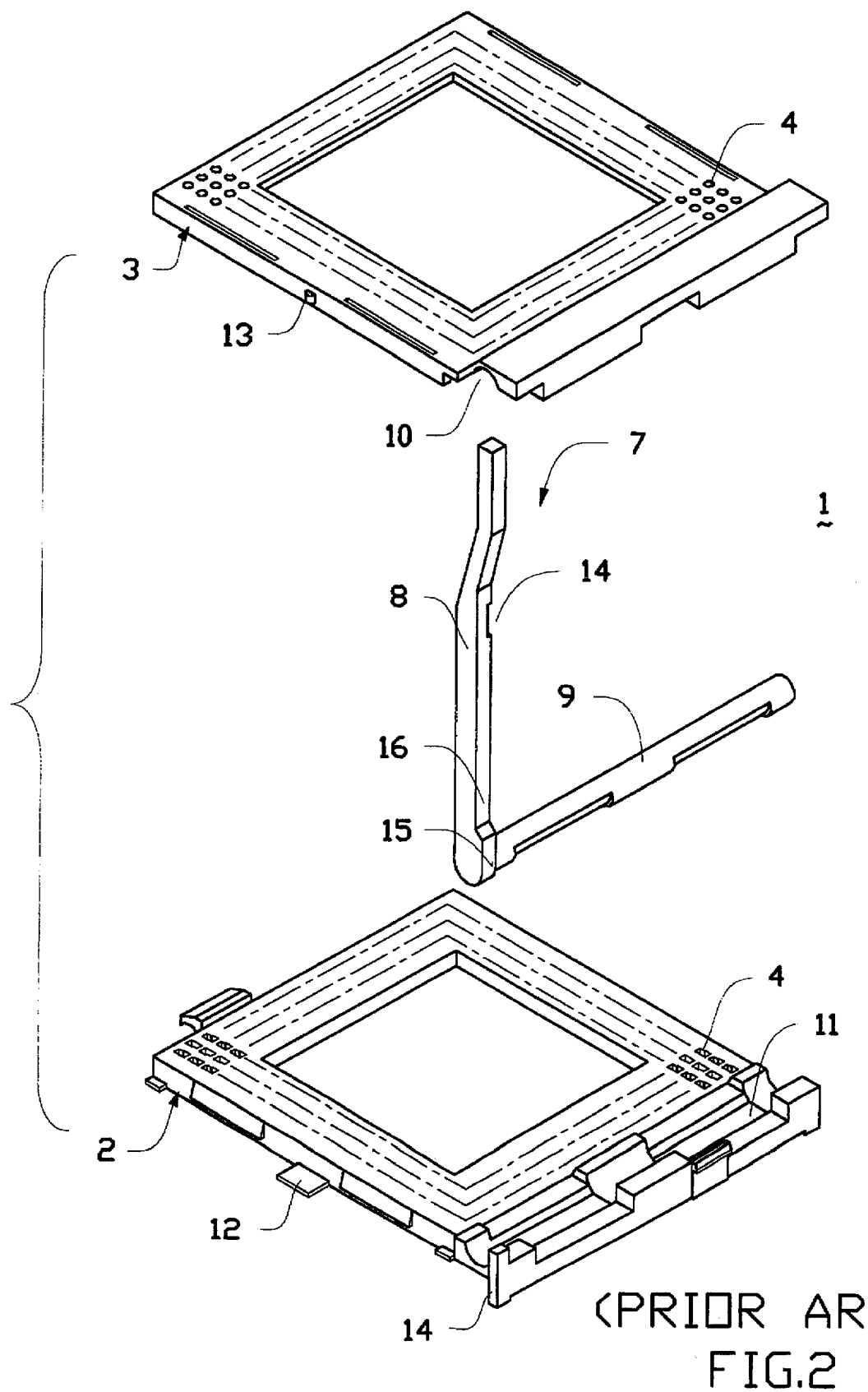
FIG. 2 is an exploded perspective view of the ZIF PGA socket of FIG. 1.
Figure 3:
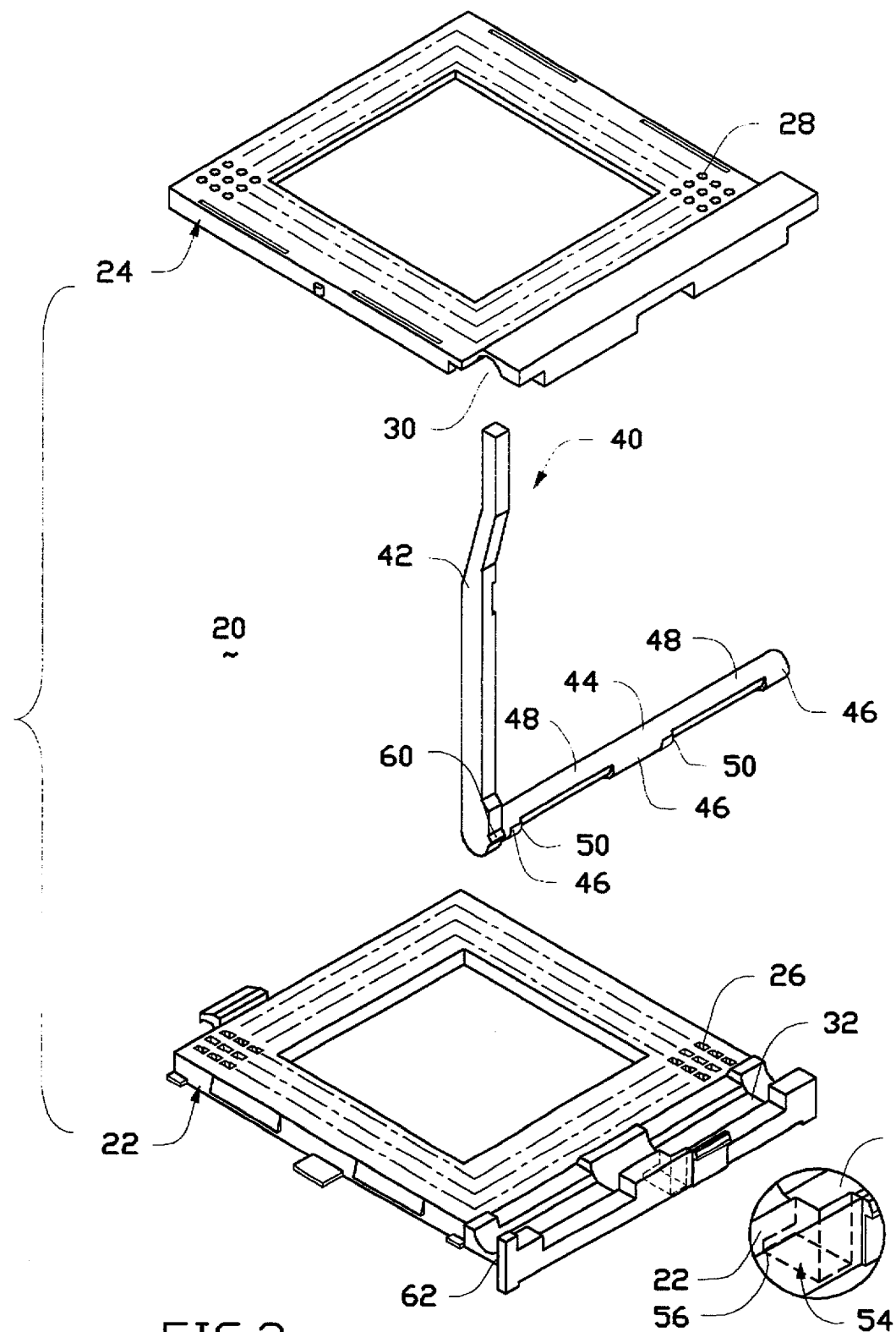
FIG. 3 an exploded perspective view of a ZIF PGA socket according to the invention.
Figure 4:
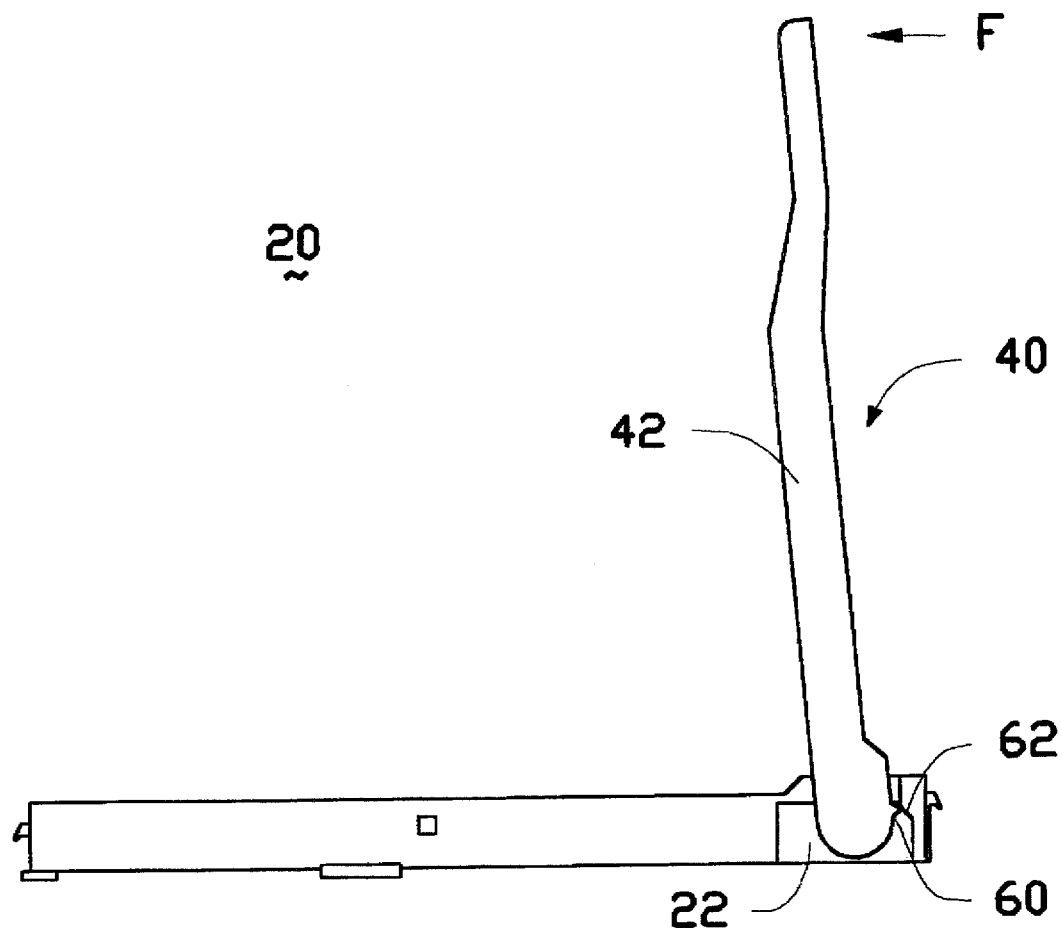
FIG. 4 is a side view of the assembled ZIF PGA socket of FIG. 3 to show the rib on the handle and the abutment surface on the base.

It will be noted here that for a better understanding, most of like components are designated by like reference numerals throughout the various figures in the embodiments. Attention is now directed to FIGS. 3, 3(A) and 4, wherein a ZIF PGA socket 20 includes a housing 21 composed of a base 22 and a cover 24 relatively slidable moveable on the base 22. The base 22 includes a plurality of passageways 26 in respective alignment with a corresponding number of passageways 28 in the cover 24 for receiving the contacts (not shown) and/or the inserted pins extending downward from the PGA as shown in FIG. 1. The contacts of the socket 20 and the operation of the contacts may be referred to the aforementioned U.S. patent application Ser. No. 08/217,606. A lever 40 includes a handle 42 and a cam shaft 44 joined adjacent the front end of the handle 42. The cam shaft 44 generally includes three supportable round rotation segments 46 for being properly seated and smoothly rotatively moveable within the upper half channel 30 in the cover 24 and the lower half channel 32 in the base 22, and two engaging segments 48 each positioned between every two supportable rotation segments 46 for pushing the cover 24 to horizontally move, correspondingly.

Figure 5:
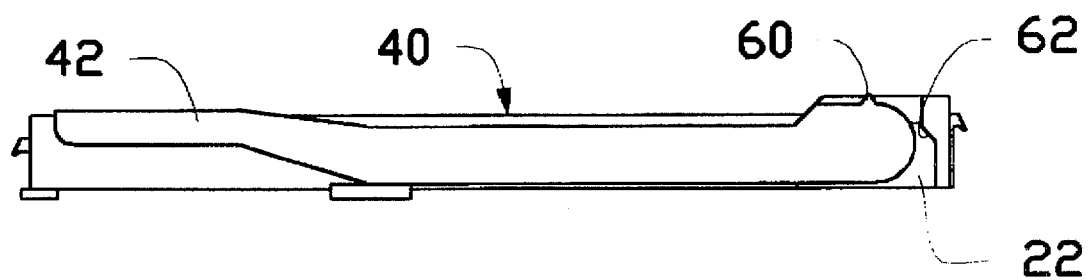
FIG. 5(A) is a side view of the assembled ZIF PGA socket of FIG. 3 wherein the handle is in a horizontal position.
FIG. 5(B) is a partially cross-sectional view of the assembled socket of FIG. 3 to show the projection of the shaft is not received within the opening wherein the handle is in a horizontal position.
Figure 5:
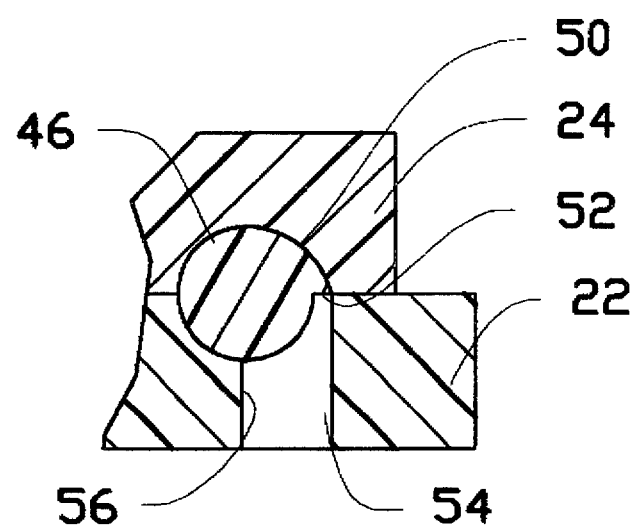
Figure 6:
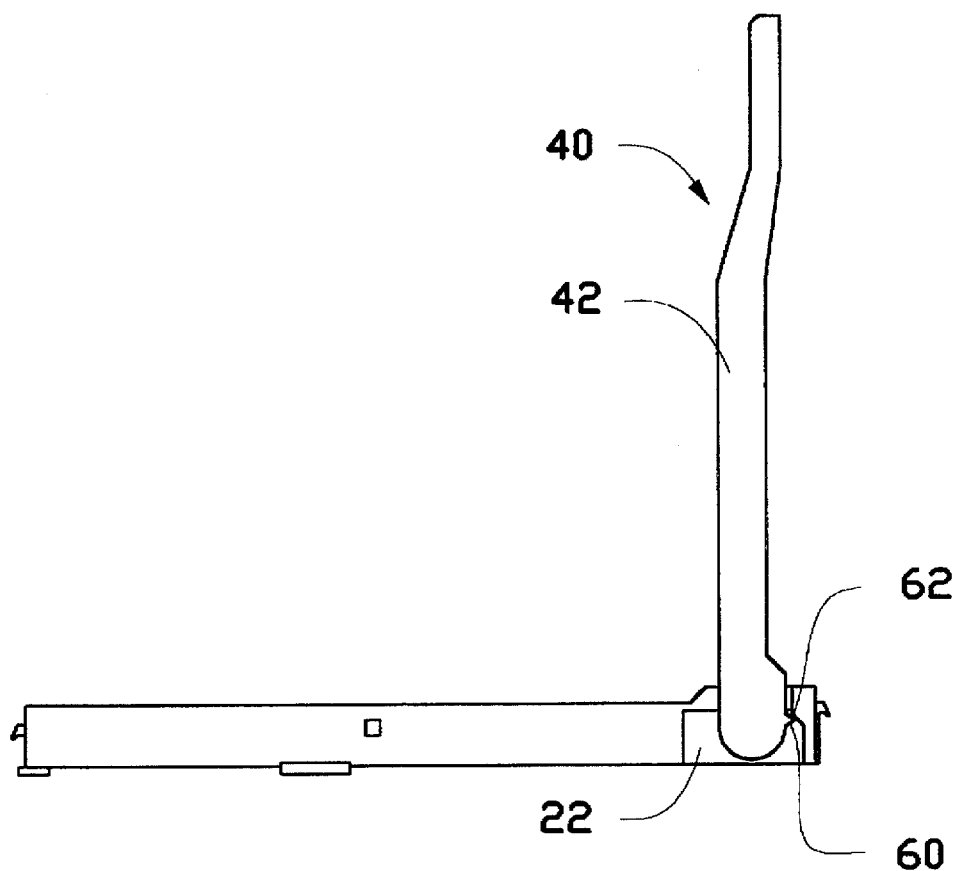
FIG. 6(A) is a side view of the assembled ZIF PGA socket of FIG. 3 wherein the handle is in a vertical position.
FIG. 6(B) is a partially cross-sectional view of the assembled socket of FIG. 3 to show the projection of the shaft is fully received within the opening wherein the handle is in a vertical direction.
Figure 6:
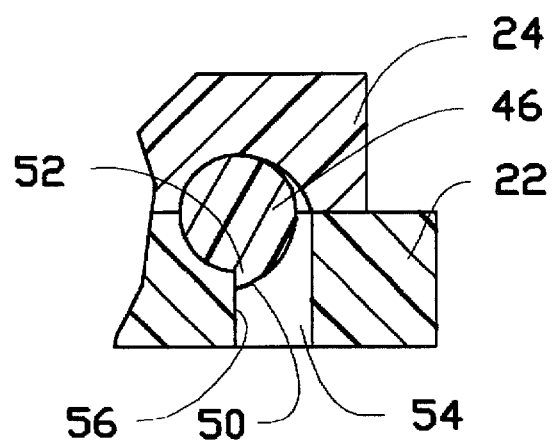

Also referring to FIGS. 5(B) and 6(B), different from the prior art, the cam shaft 44 further includes two curvilinear projections 50 each radially and outwardly integrally extending from the corresponding rotation segment 46 wherein the projection 50 includes a first engagement surface 52. Corresponding to the engagement surface 52 of each projection 50, the base 22 includes an through opening 54 extending therethrough vertically to form a second engagement surface 56 for engagement with the first engagement surface 52 on the projection 50. Therefore, referring to FIG. 5(A) and 5(B), when the handle 42 is located in a horizontal position, the projection 50 of the cam shaft 44 does not enter and is not received in the opening 54 in the base 22; oppositely, referring to FIGS. 6(A) and 6(B), when the handle 42 of the lever 40 is rotated to the vertical position, the projection 50 does substantially enter and is received in the opening 54 in the base 22 wherein the first engagement surface 52 of the projection 50 butts the second engagement surface 56 of the base 22 for efficiently stopping further rotation of the cam shaft 44 of the lever 40. Thus, the handle 42 can not help but stop at its final vertical position without any further rotative movement.

Moreover, referring back to FIGS. 3 and 4, to retain the handle 42 of the lever 40 in its vertical position, a rib 60 is formed on the front end surface of the handle 44 of the lever 40 and a downward abutment surface 62 is formed on the base 22 in alignment with the rib 60 of the handle 42 so that when the handle 42 of the lever 40 is in its final vertical position, the rib 60 may abut against the abutment surface 62 on the base 22 so that the handle 42 of the lever 40 may not inadvertently fall down back to its horizontal position as shown in FIG. 6(A). In contrast, only applying an substantial force F onto the handle 42 of the lever 40, the rib 60 of the handle 42 of the lever 40 may be disengaged from the corresponding abutment surface 62 of the base 22, and thus the handle 42 of the lever 40 may be back to its original horizontal position.

It can be contemplated that in comparison with the prior art socket, the socket of the invention is easy to be operated and has a better mechanical function. While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A ZIF PGA socket comprising:

a housing including a base and a cover;

said base having a plurality of first passageways extending therein;

said cover having a corresponding number of second passageways extending therein in alignment with the corresponding first passageways, respectively;

a lever including a handle and a cam shaft joined adjacent a front end of the handle; and a first engagement surface provided on the shaft and a second engagement surface provided on the housing whereby when the handle is in a final vertical position, the first engagement surface and the second engagement surface are engaged with each other for stopping further forward rotation of the handle of the lever; wherein said lever further includes a rib at adjacent said front end of the handle for engagement with a downward abutment surface formed on the base whereby only applying an intentional force unto the handle of the lever may disengage said rib from said abutment surface for moving the handle of the lever back to an original horizontal position.

2. The socket as defined in claim 1, wherein said first engagement surface is formed by a projection radially and outwardly extending from the shaft.

3. The socket as defined in claim 1, wherein said second engagement surface is formed by an opening extending downward in the base.

4. A ZIF PGA socket for mating with a PGA, comprising:

a housing comprising a base and a cover;

said base having a plurality of first passageways extending therein;

said cover having a corresponding number of second passageways extending therein in alignment with the corresponding first passageways, respectively, the first passageways in the base cooperating with the second passageways in the cover for receiving a corresponding number of pins downward extending from said PGA; and a lever including a handle and a cam shaft joined adjacent a front end of the handle; wherein first means is formed on said front end of the handle for releasably abutting against second means of the base for retaining said handle of the lever in a final vertical position and said first means is a rib and said second means is a downward abutment surface.

5. A ZIF PGA socket comprising:

a housing composed of a base and a cover;

said base having a plurality of first passageways extending therein;

said cover having a corresponding number of said passageways extending therein in alignment with the corresponding first passageways, respectively;

a lever including a handle and a cam shaft joined adjacent a front end of the handle;

said cam shaft further including plural supportable round rotation segments and plural engagement segments; and first engagement means provided on the shaft and second engagement means provided on the housing whereby when the handle is in a final vertical position, said first engagement means and said second engagement means are engaged with each other for stopping further forward rotation of the handle of the lever; wherein said first engagement means includes lateral projections on the rotation segments of the cam shaft and said second engagement means includes openings formed in the base.

6. A ZIF PGA socket comprising:

a housing including a base and a cover;

said base having a plurality of first passageways extending therein;

said cover having a corresponding number of second passageways extending therein in alignment with the corresponding first passageways, respectively;

a lever including a handle and a cam shaft joined adjacent a front end of the handle; and a first engagement surface provided on the shaft and a second engagement surface provided on the housing whereby when the handle is in a final vertical position, the first engagement surface and the second engagement surface are engaged with each other for stopping further forward rotation of the handle of the lever; wherein said first engagement surface is formed by a projection radially and outwardly extending from the cam shaft and said second engagement surface is formed by an opening extending downward in the base.

* * * * *